May 29, 1956 D. A. JENNY 2,748,325

SEMI-CONDUCTOR DEVICES AND METHODS FOR TREATING SAME

Filed April 16, 1953

INVENTOR.

DIETRICH A. JENNY

BY J. L. Whittaker

ATTORNEY

United States Patent Office 2,748,325

Patented May 29, 1956

2,748,325

SEMI-CONDUCTOR DEVICES AND METHODS FOR TREATING SAME

Dietrich A. Jenny, Princeton, N. J., assignor to Radio Corporation of America, a corporation of Delaware Application April 16, 1953, Serial No. 349,296

17 Claims. (Cl. 317—234)

This invention relates to semi-conductor devices and more particularly to an improved method for protecting the surface of a semi-conductor device having a P–N rectifying junction.

It is well known to make a semi-conductor device by fusing upon a surface of a semi-conductive material such as N-type germanium a body of an impurity-yielding material such as indium to produce a P–N rectifying junction. A P–N rectifying junction so formed is disposed principally within the semi-conductive body; however, its periphery extends to the surface of the body and since the effectiveness of a P–N rectifying junction depends upon its electrical resistance, it must be protected from external influences that may tend to form an electrical leakage path around it or to short-circuit it. In particular, upon completion of the fusing process it is sometimes found that the junction has been short-circuited by a film of the impurity-yielding metal that has spread across the junction on the surface of the semi-conductive body. Because of this it has been an accepted practice to etch all such devices in an acid or alkaline solution to remove such short-circuiting material, after which a protective coating is applied to the devices.

Semi-conductor devices of the kind called transistors are usually also provided with a base tab having a tinned surface that is fused to the semi-conductive body simultaneously with the forming of two rectifying junctions within the body. In etching away the short-circuiting material mentioned above, difficulty has been experienced due to a chemical plating effect that deposits from the etching solution a thin metallic film, thought to be tin, upon the exposed portions of the junctions, thus adversely affecting their performance. To prevent this, care must be taken when etching a transistor not to immerse any portion of the tinned surface of its base tab into the etching bath. Since many transistors are relatively small in size, immersing only the semi-conductive body into the etching bath while keeping the base tab out of the bath has proven a tedious and difficult operation.

Accordingly, it is an object of the present invention to provide an improved method for removing from the surface of a semi-conductor device material that tends to cause electrical leakage around or that short-circuits a P–N rectifying junction of the device.

Another object of the invention is to provide an improved method for protecting exposed portions of a P–N rectifying junction of a semi-conductor device.

Still another object is to provide an improved method for removing undesired material from the surface of a semi-conductor device and simultaneously forming a protective insulating film upon the surface.

Another object is to provide a semi-conductor device having a P–N rectifying junction of improved stability with respect to external influences.

According to the present invention, a semi-conductor device comprising a body of semi-conductive material having a P–N rectifying junction with its periphery exposed upon the surface of the body is placed in a stream of heated oxygen or other reactive gas such as fluorine. The oxygen combines with the material upon the surface of the device and forms an insulating film over all the device. Conductive material that is disposed in a position to short-circuit the junction is converted to an insulating oxide, thus not only is an electrical leakage path removed from across the junction but also a protective insulating film is formed that covers and protects the exposed portions of the junction from subsequent contamination.

The invention will be more easily understood by reference to the following detailed description and to the drawing of which:

Figure 1:
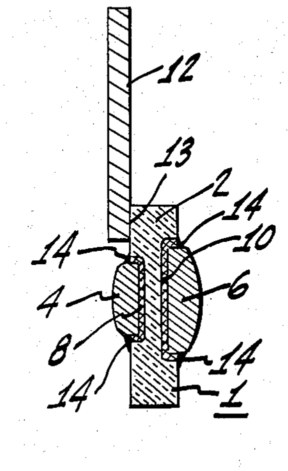
Figure 1 is a schematized, cross-sectional, elevational view of a device prior to treatment according to the invention.

According to a preferred embodiment of the invention, a device such as the transistor shown in Figure 1 is treated to produce a protective film upon its surface and to remove undesirable effects therefrom. Figure 1 shows a transistor 1 having a base 2 of N-type semi-conductive germanium, an emitter electrode 4 which may be of indium fused to the base, a collector electrode 6 which may also be of indium and is fused to the opposite side of the base, two P–N rectifying junctions 8 and 10, and a base tab 12 having a tinned surface 13 forming a non-rectifying junction with the base 2. During the heating of the device to form the P–N rectifying junctions and to fuse the base tab to the base, the emitter and the collector electrodes are melted and portions 14 of the material of these electrodes may spread over the surface of the base effectively short-circuiting the P–N rectifying junctions. To produce a transistor having desirable electrical properties, it is necessary to remove the electrical leakage paths or short-circuits that are disposed across the junctions. This may be done by etching, as in previous practice, which removes the material causing the short-circuit. However, advantageously and more conveniently, the short-circuit may be removed by the practice of the invention, as illustrated in Figure 2, which does not remove the material but converts it to an insulating film.

Figure 2:
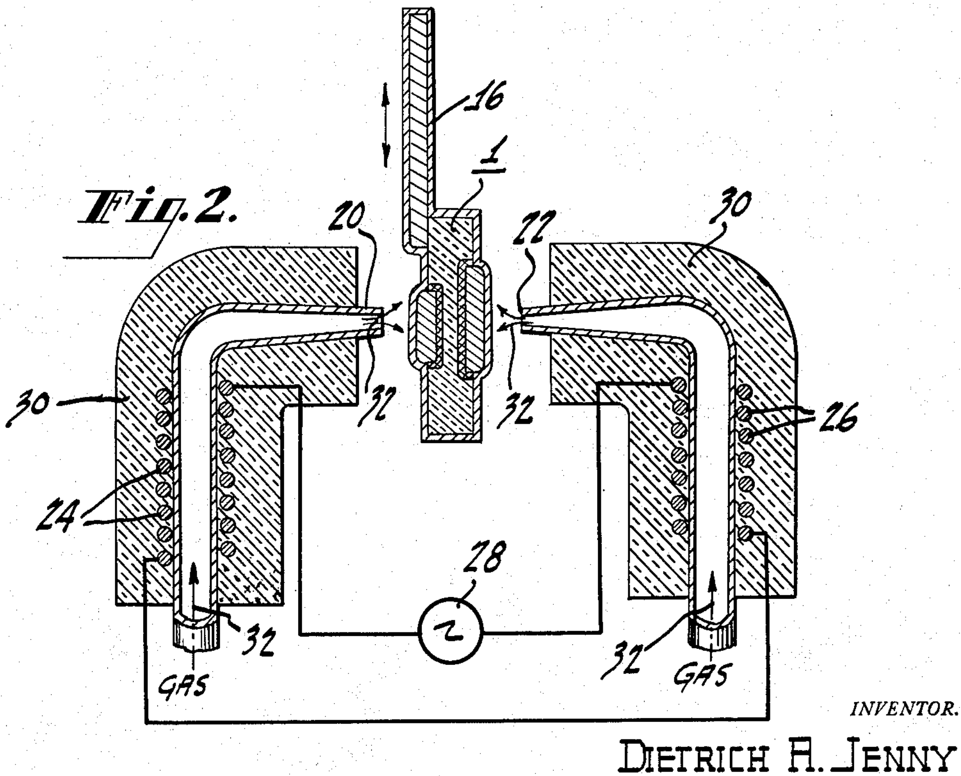
Figure 2 is a schematized, cross-sectional, elevational view of the device of Figure 1 treated according to the invention and of apparatus for such treatment.

Figure 2 illustrates the treatment of a transistor according to the invention. The transistor 1 as described in connection with Figure 1 is placed between two nozzles 20 and 22. The nozzles are provided with any suitable heating means such as heating coils 24 and 26 which are connected to a source of electric power 28. The nozzles are preferably of a refractory material such as graphite, capable of withstanding relatively high temperatures, and chemically inert with respect to hot reactive gases such as oxygen and fluorine. They are preferably surrounded with an insulating material 30 to prevent undesirable dissipation of heat. A stream of oxygen, indicated by the arrows 32, is directed through the nozzles to impinge upon the surface of the transistor and to react with the material on the exposed surfaces of the transistor to form a film of insulating metallic oxide 16 thereon.

By a suitable control of the temperature of the oxygen, the amount of the surface material reacted and the thickness of the insulating film formed may be controlled as desired so as to effect the complete reaction of all the material 14 (Figure 1) lying across the exposed periphery of the rectifying junction. Preferably, the oxygen should be heated to a temperature of about 600° C. to 800° C. and the transistor should be exposed to it for about one second to one minute, although lower temperatures and longer exposures may be employed. Generally, there is an inverse relation between the temperature of the gas and the time of exposure. When employing a temperature above the melting point of a material of the device being treated the time of exposure should be relatively brief in order to avoid melting a substantial portion of the device.

Alternatively other reactive gases may be substituted in place of oxygen, although the optimum temperature to which the gas should be heated will depend upon the gas used. For example, fluorine may be employed at a temperature considerably below 600° C. such as about 50° C. to 300° C. Other gases are also suitable such as any of the halogens, hydrogen, nitrogen, or gaseous compounds such as $SO_2$, $CO_2$, $NO_2$ and others that are capable of reacting spontaneously with metals at elevated temperatures to produce an electrically insulating compound.

Adjustments of the temperature of the gas may also be desirable depending upon the materials on the surface of the transistor. Silicon, for example, which constitutes the base of some transistors, oxidizes readily at a relatively low temperature, while germanium, which constitutes the base of the transistor described above, oxidizes less readily and requires a higher temperature than silicon. Collector and emitter electrodes of transistors may be made of different materials, such as indium, gallium, antimony and aluminum, each of which has its own peculiar oxidation characteristic. Generally, satisfactory results are obtained if the temperature of the gas is adjusted to oxidize the surface of the most difficultly oxidizable material in the transistor and to produce upon that surface a relatively thin film of an insulating salt or oxide.

It should be understood that the apparatus illustrated and described in connection with the preferred embodiment of the invention is neither a part of nor essential in the practice of the invention. Satisfactory results may be obtained by any means for immersing a device in an atmosphere rich in a reactive gas at an elevated temperature. For example, such alternative means may comprise a partially enclosed heated chamber in which a reactive atmosphere is maintained at an elevated temperature, and into which the device is inserted for treatment.

To incorporate the device produced according to the present invention in a circuit it is usually desired to attach electrical leads to the electrodes and to the base tab. This may be done by any well known means such as soldering prior to treatment of the device by the reactive gas, or more conveniently, such leads may be attached subsequent to such treatment. In attaching these leads little difficulty is experienced due to the insulating film upon the surfaces. A relatively small region of the electrode material may easily be melted, by means of heating an electrical lead wire placed in contact with the electrode, for example, thus permitting the lead wire to penetrate the insulating film and to contact the electrode material. In the case of the base tab, the tin coating upon its surface may likewise be melted to permit an electrical contact to be made to it.

After electrical leads have been attached to the base tab and to the electrodes, the device may be mounted and potted in a plastic material according to usual techniques.

It should be understood that the practice of the invention is not limited to devices of the exact type described in connection with the preferred embodiment above, but that it is equally applicable to the production of semi-conductor devices of other types, such as a grown junction transistor, having a P–N rectifying junction at least partially exposed upon its surface. In general the invention provides an improved process that may be advantageously substituted for the previous process of etching in a wet solution in the production of semi-conductor devices having exposed P–N rectifying junctions.

There have thus been described new and improved semi-conductor devices and methods of treating them, which devices bear a protective, insulating film upon their surfaces, and which methods permit the production without etching by a wet process of semi-conductor devices having P–N rectifying junctions.

What is claimed is:

1. A method of treating the surface of a semi-conductor device having a P–N rectifying junction at least partially exposed upon said surface comprising exposing said surface to an atmosphere comprising a reactive gas maintained at an elevated temperature.

2. The method step according to claim 1 in which said gas is oxygen.

3. The method step according to claim 1 in which said gas is a halogen.

4. The method step according to claim 3 in which said halogen is fluorine.

5. The method step according to claim 1 in which said gas is sulfur dioxide.

6. In a method of making a semi-conductor device having a P–N rectifying junction comprising fusing an indium body to a body of N-type semi-conductive germanium, the step of thereafter immersing said device in an atmosphere rich in oxygen, and maintaining said atmosphere at about 600° C. to 800° C.

7. In a method for making a semi-conductor device having a P–N rectifying junction which method comprises fusing a body of impurity-yielding material to a surface of a semi-conductive body, the step of thereafter immersing said device in an atmosphere comprising a reactive gas, said gas being maintained at an elevated temperature.

8. A semi-conductor device comprising a body of semi-conductive material having fused to a surface thereof a body of impurity-yielding material, a P–N rectifying junction disposed within said semi-conductive body adjacent to said impurity-yielding body and a film of an inert insulating material upon the surface of said device, said film comprising compounds of said semi-conductive material and of said impurity-yielding material.

9. A method of making a semi-conductor device comprising fusing to a surface of a body of semi-conducting material a quantity of an electrically conducting impurity-yielding substance whereby to form a P–N rectifying junction within said body with a portion of said junction extending to a surface of said body but covered by a film of said impurity-yielding substance, and converting said film to an electrically insulating substance.

10. The method according to claim 9 in which said film is converted to an electrically insulating substance by contact with a reactive gas.

11. The method according to claim 10 in which said reactive gas is oxygen and is maintained at an elevated temperature.

12. The method according to claim 10 in which said reactive gas is a halogen and is maintained at an elevated temperature.

13. A semi-conductor device comprising a body of semi-conductive material having a rectifying electrode alloyed to a surface thereof, a P–N rectifying junction disposed within said body adjacent to said electrode, and a film of an insulating material upon said surface, said insulating material comprising a compound of said semi-conductive material.

14. A device according to claim 13 in which said compounds are oxides.

15. A semi-conductor device comprising a body of a semi-conductive material having a P–N rectifying junction disposed therein, and a film of an insulating material upon a surface thereof, said insulating material comprising a halide of said semi-conductive material.

16. A device according to claim 15 in which said halide is a fluoride.

17. A semi-conductor device comprising a body of a semi-conductive material having a P–N rectifying junction disposed therein, and a film of an insulating material upon a surface thereof, said insulating material comprising a sulfur salt of said semi-conductive material.

References Cited in the file of this patent

UNITED STATES PATENTS

| | | |
|---|---|---|
| 2,524,035 | Bardeen et al. | Oct. 3, 1950 |
| 2,560,792 | Gibney | July 17, 1951 |
| 2,592,683 | Gray | Apr. 15, 1952 |